(12) United States Patent
Voldman

(10) Patent No.: US 6,720,637 B2
(45) Date of Patent: Apr. 13, 2004

(54) SIGE TRANSISTOR, VARACTOR AND P-I-N VELOCITY SATURATED BALLASTING ELEMENT FOR BICMOS PERIPHERAL CIRCUITS AND ESD NETWORKS

(75) Inventor: Steven Howard Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/353,176

(22) Filed: Jan. 28, 2003

(65) Prior Publication Data

US 2003/0146484 A1 Aug. 7, 2003

Related U.S. Application Data

(62) Division of application No. 09/677,898, filed on Oct. 3, 2000, now Pat. No. 6,552,406.

(51) Int. Cl.[7] ............................................. H01L 27/095
(52) U.S. Cl. ..................... 257/473; 257/192; 257/355; 257/356; 257/360
(58) Field of Search ................ 257/192, 35.5, 257/356, 360

(56) References Cited

U.S. PATENT DOCUMENTS

| | | |
|---|---|---|
| 5,006,912 A | 4/1991 | Smith et al. |
| 5,391,503 A | 2/1995 | Miwa et al. |
| 5,517,049 A | 5/1996 | Huang |
| 5,618,740 A | 4/1997 | Huang |
| 5,629,544 A | 5/1997 | Voldman et al. |
| 5,767,552 A | 6/1998 | Casper et al. |
| 5,872,378 A | 2/1999 | Rose et al. |
| 6,049,119 A | 4/2000 | Smith |
| 6,198,135 B1 * | 3/2001 | Sonoda ........................ 257/355 |

FOREIGN PATENT DOCUMENTS

JP     11-214627     8/1999

* cited by examiner

*Primary Examiner*—Son Mai
*Assistant Examiner*—Mai-Huong Tran
(74) *Attorney, Agent, or Firm*—Scully, Scott, Murphy & Presser; Richard A. Henkler, Esq.

(57) ABSTRACT

An SiGe device configured to exhibit high velocity saturation resistance characteristic for buffering large voltages at low currents, wherein for circuit applications, the SiGe device is connected in series with a circuit element for protection of the circuit element. Advantageously, the device may be exploited as a buffer element providing ESD circuit protection for receiver devices, power supply clamp circuits and I/O driver circuits.

8 Claims, 8 Drawing Sheets

Figure 6
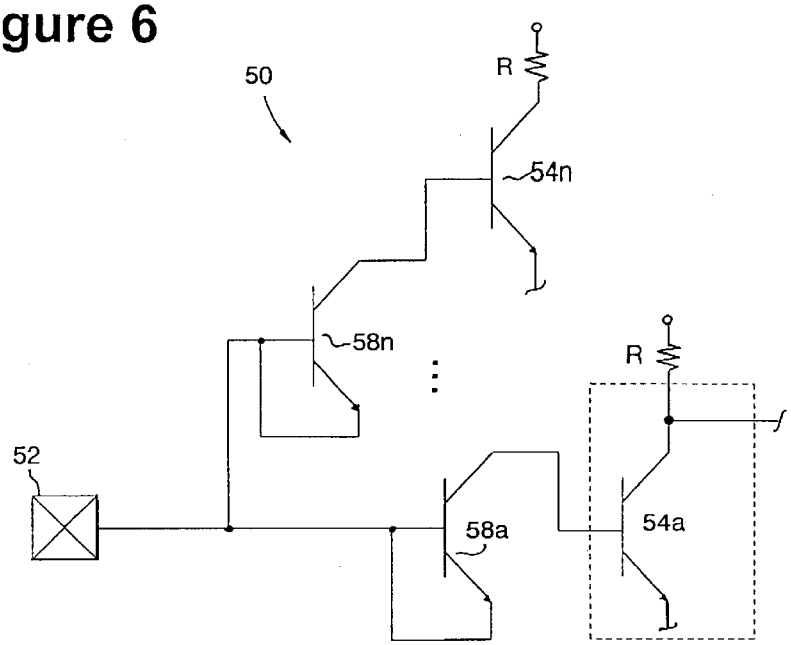
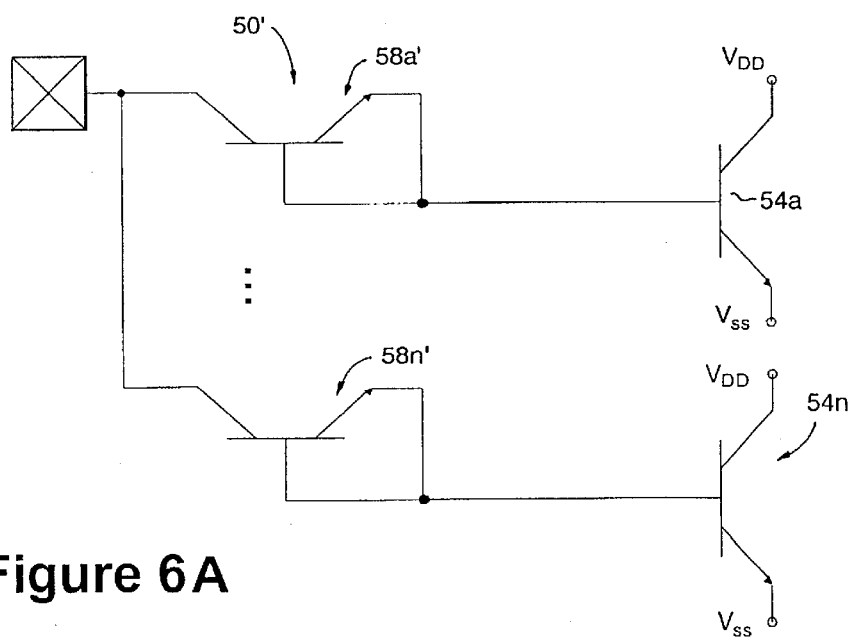
Figure 6A

US 6,720,637 B2

SIGE TRANSISTOR, VARACTOR AND P-I-N VELOCITY SATURATED BALLASTING ELEMENT FOR BICMOS PERIPHERAL CIRCUITS AND ESD NETWORKS

RELATED APPLICATIONS

This application is a divisional of U.S. application Ser. No. 09/677,898, filed Oct. 3, 2000 now U.S. Pat. No. 6,552,406.

BACKGROUND OF THE INVENTION

1. Field of the Invention

The present invention relates generally to electrostatic discharge protection and over-current protection of electronic devices, and more specifically, to the use of silicon germanium (SiGe) devices functioning as ESD circuit elements for protecting electronic I/O circuits.

2. Discussion of the Prior Art

Electrostatic discharge protection in BiCMOS or CMOS electronic devices typically utilize resistive elements, e.g., resistors. However, the resistor elements used in BiCMOS or CMOS exhibit linear resistance characteristics and do not demonstrate strong velocity saturation (Kirk) effect, i.e., a high resistance state that is significantly above a linear resistance portion of the device's current-voltage curve. Consequently, these types of resistive elements may be suitable for applications in limited current/voltage ranges and consequently, limited types of ESD and I/O circuit applications.

It would be highly desirable to provide a device that exhibits a strong velocity saturation effect, i.e., a high dynamic-on resistance and that may be exploited to provide resistance buffering, and resistor ballasting of I/O networks and ESD networks.

It would additionally be highly desirable to provide a SiGe device dimensioned to exhibit a strong velocity saturation (Kirk) effect, to provide resistance buffering, and resistor ballasting of I/O networks and ESD networks.

SUMMARY OF THE INVENTION

It is an object of the invention to provide a SiGe transistor device dimensioned to exhibit a strong velocity saturation (Kirk) effect, and configured to provide resistance buffering, and resistor ballasting of I/O networks and ESD networks.

It is another object of the invention to provide a SiGe transistor in a diodic configuration to provide resistance buffering, and resistor ballasting of I/O networks and ESD networks, utilizing the Kirk effect velocity saturation.

According to the invention, there is provided an SiGe device configured to exhibit high velocity saturation resistance characteristic for buffering large voltages at low currents, wherein for circuit applications, the SiGe device is connected in series with a circuit element for protection of the circuit element. Advantageously, the device may be exploited as a buffer element providing ESD circuit protection for receiver devices, power supply clamp circuits and I/O driver circuits.

BRIEF DESCRIPTION OF THE DRAWINGS

Further features and advantages of the invention will become more readily apparent from a consideration of the following detailed description set forth with reference to the accompanying drawings, which specify and show preferred embodiments of the invention, wherein like elements are designated by identical references throughout the drawings; and in which:

FIG. 6 illustrates an example BiCMOS receiver circuit 50 including a network of receiver devices 54a, . . . , 54n each receiving signals from an input pad 52 through a respective current limiting SiGe heterojunction bipolar transistor (HBT) diode saturation ballast element 58a, . . . , 58n according to the invention.

FIG. 6A illustrates another example embodiment of a receiver circuit 50' as in FIG. 6, including diode saturation ballasted SiGe devices 58a', . . . , 58n' exhibiting velocity saturation characteristics according to the invention.

DETAILED DESCRIPTION OF THE INVENTION

SiGe devices in a two terminal connection, such as the base-collector diode configuration maintain a linear characteristic when the structure has a long base region. As the structure size decreases, the dynamic on-resistance of the device at high current decreases. Table 1 below illustrates the SiGe npn transistor in a diode configuration (Base-Collector) with the linear resistance, the transition voltage of velocity saturation, the saturated resistance and the structure failure voltage and failure current:

TABLE 1

| Test Mode | Width | Length | R (Linear) | Transition Voltage | R (saturated) | Failure Voltage | Failure Current |
|---|---|---|---|---|---|---|---|
| Base-Collector | 0.44 um | 0.44 | 47.6 Ohms | 4.5 V | 180 Ohms | 6.1 V | 79 mA |
| | | 0.80 | 37.7 | 4.3 V | 170 Ohms | 6.3 | 120 |
| | | 1.50 | 20.4 | 4.2 V | 160 Ohms | 5.2 | 136 |
| | | 3.00 | 14.3 | 4.0 V | 150 Ohms | 5.5 | 220 |
| | | 6.00 | 8.02 | 3.8 V | 140 Ohms | 6.3 | 335 |
| | | 12.00 | 4.55 | 3.5 V | 80 Ohms | 5.9 | 510 |
| | | 47.6 | 1.45 | None | None | 2.8 V | 1.2 Amps |

As shown in Table 1, the SiGe device in such a two terminal connection, i.e., base-collector diode configuration, maintains a linear characteristic when the structure has a wide base region and, moreover, as the structure size decreases, the dynamic on-resistance of the device at high current decreases. The results of Table 1 further show that with a large SiGe npn, a low linear resistance structure may be obtained with no saturation phenomenon prior to failure. As the base length is decreased to 12 μm, the onset of velocity saturation leads to a transition to a high resistance state that is significantly above the linear resistance. The structure current does not increase leading the ability to buffer off a voltage of 5.9 Volts at a failure current of 510 mA. The voltage at which the velocity saturation occurs is about 3 V across the SiGe transistor.

Figure 1:
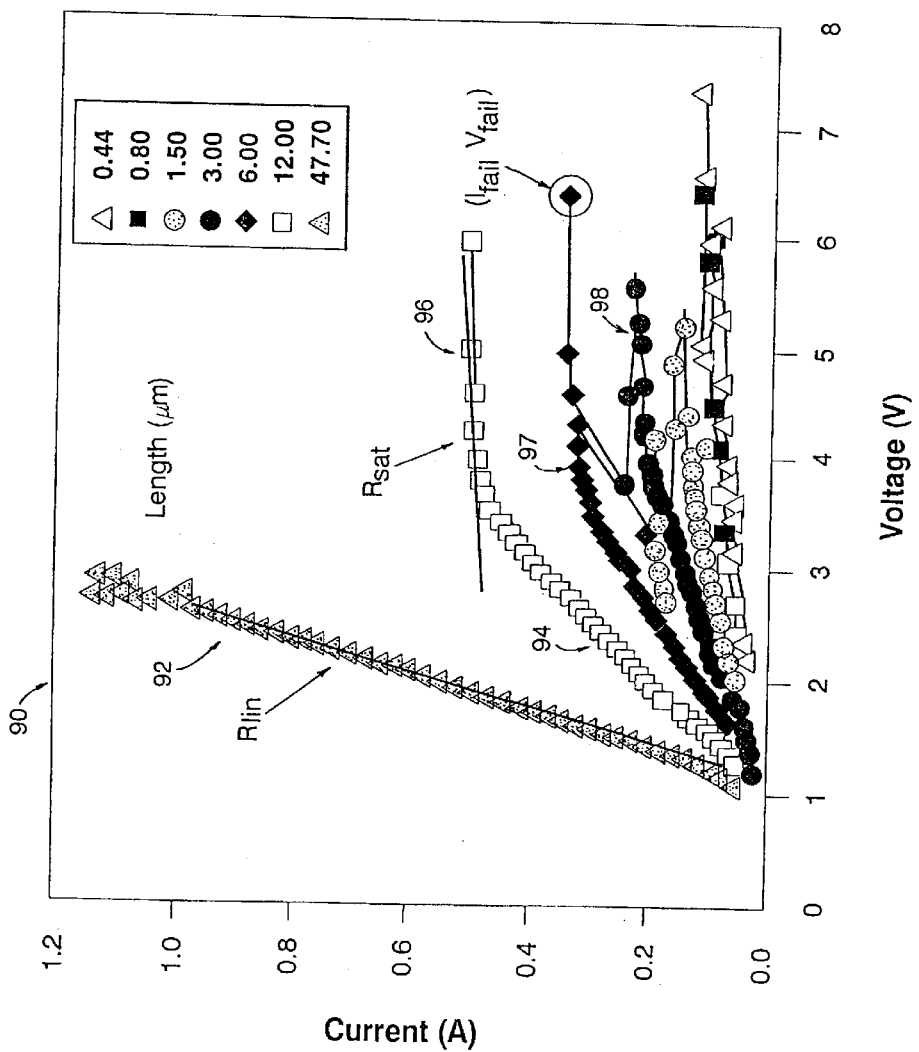
FIG. 1 is a chart depicting the current v. voltage characteristic of the diode-configured SiGe npn transistor (and varactor or PIN diode) at various device structure lengths.

FIG. 1 is a graph 90 depicting the current v. voltage characteristic of the diode-configured SiGe npn transistor (and varactor or PIN diode) at various device structure lengths. As shown in FIG. 1, SiGe npn transistor (and varactor or PIN diode) of longer lengths, e.g., 47 μm do not exhibit the velocity saturation effect as represented by the line 92. As depicted in FIG. 1, a low linear resistance SiGe npn transistor (and varactor or PIN diode or npn base-collector junction) structure, e.g., at 12 μm in length, exhibits a linear resistance 94 at low voltages and current and, exhibits diode velocity saturation 96. At some point along that line 96 the device will fail. As the length of the SiGe npn transistor (and varactor or PIN diode) structure decreases, e.g., below 12 μm in length such as represented by line 97, the current capability decreases, however, the device still exhibits diode velocity saturation at lower currents as depicted at 98.

With greater specificity, to exploit this effect, in a first embodiment, a SiGe npn (and in further embodiments, a p-i-n SiGe diode, and a SiGe varactor or SiGE Schottky) may be placed in a series configuration with peripheral receivers or drivers in such a manner to avoid electrothermal failure of the peripheral circuit. The element may also be divided into a plurality of SiGe transistors in parallel with a plurality of parallel I/O elements to provide the current distribution and velocity saturation effects. SiGe P-i-n diode and varactor structures also demonstrate the collector saturation phenomenon and FIG. 1 data demonstrates the transition from low to high resistance states. These structures also show a 10–20× increase in resistance as the structures undergo saturation phenomenon. According to the invention, thus, a SiGe npn, varactor or p-i-n diode is configured in a series configuration with an I/O network device where the collector saturation is used advantageously to protect I/O circuitry. These elements can be placed in a parallel configuration for current ballasting across all I/O legs of the I/O network.

FIGS. 2–8 illustrate various circuit applications for the inventive SiGe structure which includes: the diode configured SiGe velocity saturation element, an SiGe p-i-n diode, SiGe varactor or Schottky diode, etc. The devices of FIGS. 2–8 include: 1) Receiver networks: where an example embodiment is a SiGe in diode configuration in series with an emitter or base of a SiGe npn receiver; 2) I/O driver circuits: where an example embodiment includes an SiGe npn in pull-down network in series with the SiGe npn driver pull-down; and, 3) ESD power clamps: where an example embodiment includes an output SiGe npn in series with the ESD power clamp NFET or SiGe npn output clamp element.

Figure 2:
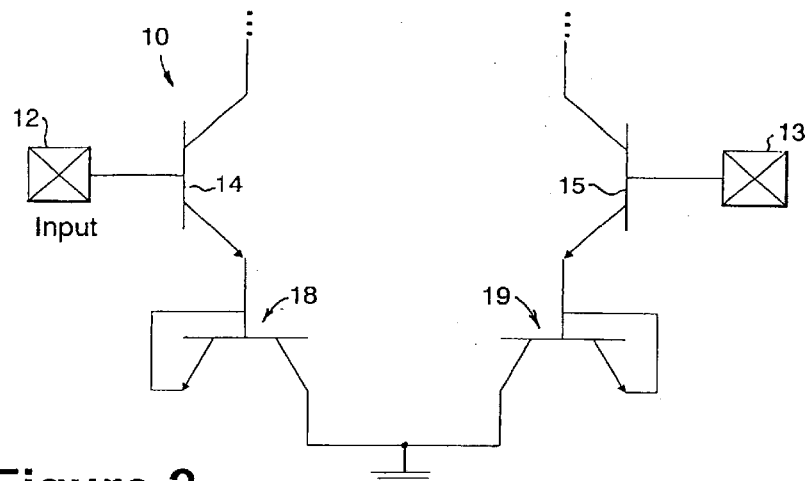
FIGS. 2 and 2A illustrate example differential receiver circuit configurations 10, 10' implementing diode saturation ballasted SiGe devices according to the invention.
Figure 2A:
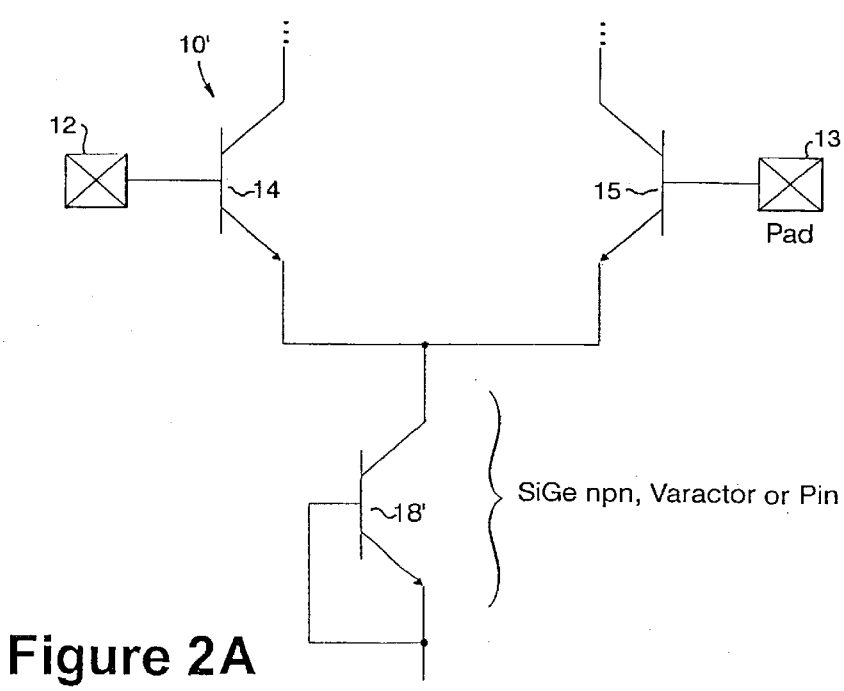

As shown in FIG. 2, there is depicted an example differential receiver circuit 10 including diode saturation ballasted SiGe devices 18, 19 according to the invention. The differential receiver circuit 10 comprises first and second input pads 12, 13 connected to respective transistor devices 14, 15 in a differential receive configuration for receiving input signals, with the emitter of each transistor device 14, 15 connected in series with a respective diode configured SiGe diode saturation element 18, 19 for providing overcurrent protection. FIG. 2A illustrates another example embodiment of a differential receiver circuit 10' including diode saturation ballasted SiGe device 18' exhibiting velocity saturation characteristics according to the invention.

Figure 3:
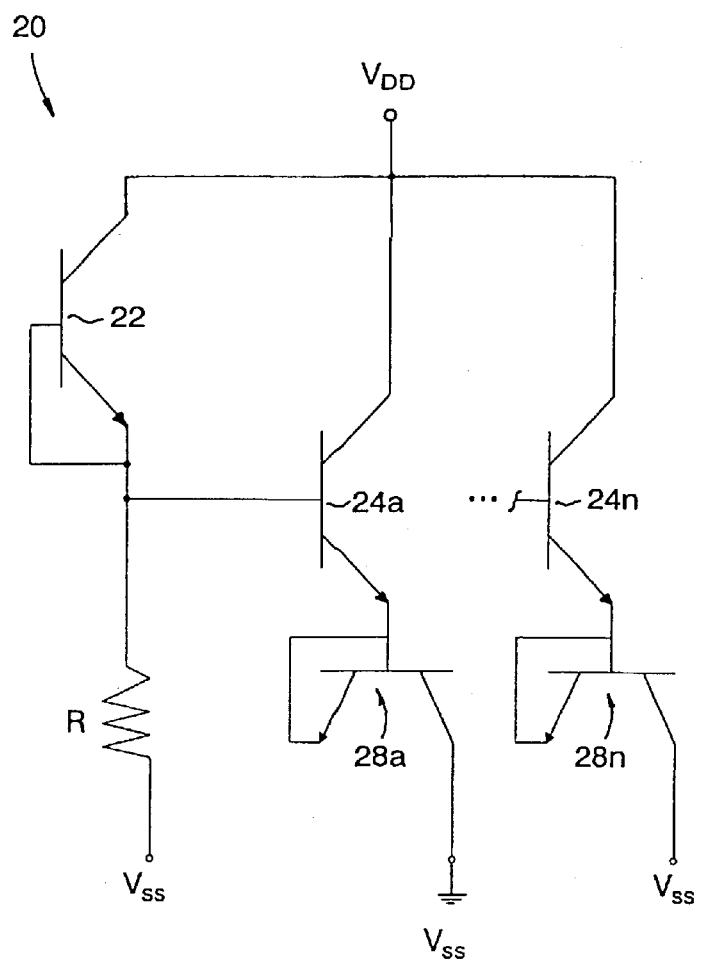
FIG. 3 illustrates an example Bipolar-based ESD power clamp 20 implementing SiGe diode velocity saturation ballasting elements 28a, . . . , 28n according to the invention.

FIG. 3 illustrates an example Bipolar-based ESD power clamp 20 with SiGe diode velocity saturation ballasting elements 28a, . . . , 28n according to the invention. The ESD power clamp 20 includes an SiGe npn trigger device 22 which detects an overcurrent power supply Vdd condition and at such a condition, breaks down to provide base drive for one or more SiGe npn output clamp elements 24a, . . . , 24n which are connected in series for effectively decreasing impedance between Vdd and ground for providing chip overcurrent protection. The diode configured SiGe saturation elements 28a, . . . , 28n provide resistor ballasting of the SiGe npn devices 24a, . . . , 24n.

Figure 4:
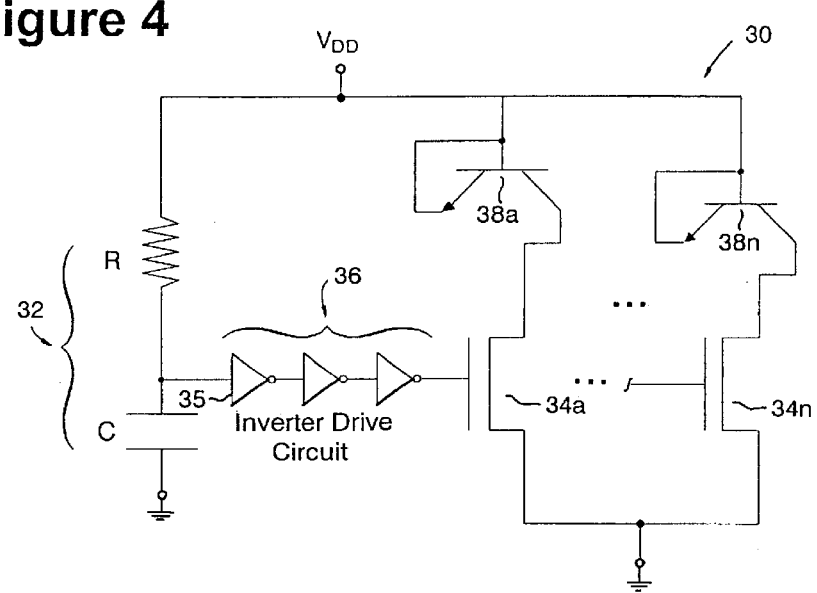
FIG. 4 illustrates an example CMOS-based ESD power clamp 30 with velocity saturation diode ballasting elements 38a, . . . , 38n of the invention.

FIG. 4 illustrates an example CMOS-based power clamp 30 with velocity saturation diode ballasting elements 38a, . . . , 38n. The CMOS-based power clamp 30 includes an RC discriminator circuit 32 which provides a device trigger according to the order of a time constant determined by resistor (R) and capacitor (C) elements that drive a plurality of NFET fingers (gates) 34a, . . . , 34n through an inverter drive circuit 36 comprising one or more inverter devices 35. The power supply Vdd of the device is connected to each of the NFET fingers 34a, . . . , 34n through a respective diode configured SiGe saturation element (SiGe npn, SiGe p-i-n, varactor or Schottky) 38a, . . . , 38n for providing current uniformity through each MOSFET 34A, . . . , 34n.

Figure 4A:
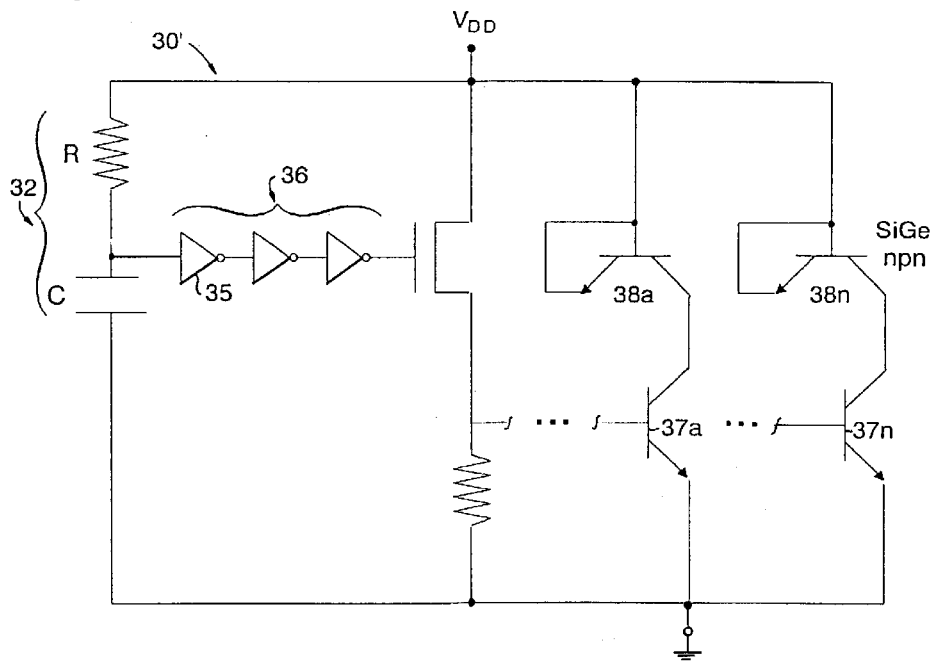
FIG. 4A illustrates an example embodiment of a bi-polar power clamp 30' as in FIG. 4 with velocity saturation diode ballasting elements 38a, . . . , 38n of the invention.

FIG. 4A illustrates an example embodiment of a bi-polar power clamp 30' wherein the power supply Vdd of the device is connected to each of the bi-polar device fingers 37a, . . . , 37n through the respective diode configured SiGe saturation element (SiGe npn, SiGe p-i-n, varactor or Schottky) 38a, . . . , 38n for limiting current to ground.

Figure 5:
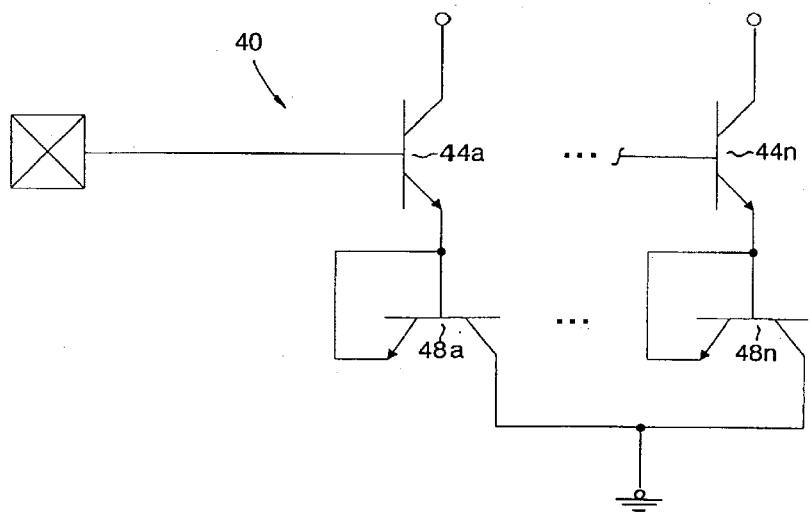
FIG. 5 illustrates an example receiver circuit 40 including diode saturation ballasted SiGe devices 48a, . . . , 48n according to the invention.
Figure 5A:
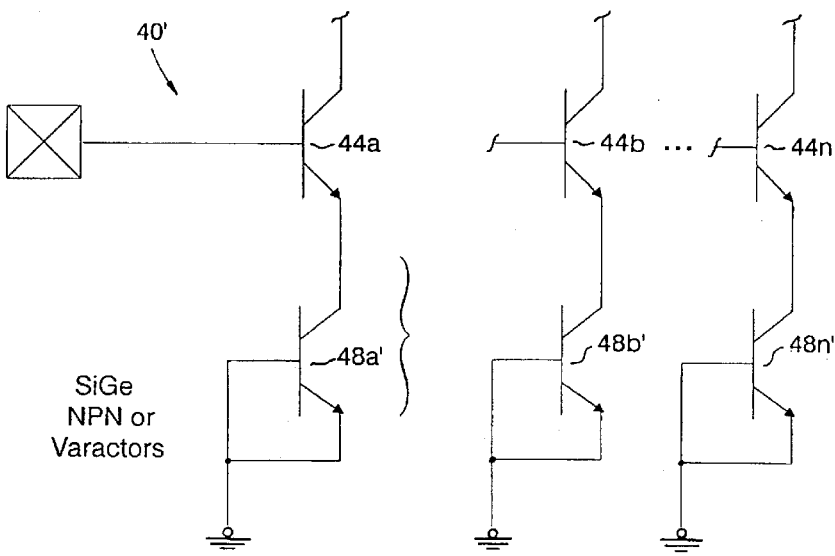
FIG. 5A illustrates another example embodiment of a receiver circuit 40' as in FIG. 5 including another configuration of diode saturation ballasted SiGe devices 48a', . . . , 48n' according to the invention.

FIG. 5 illustrates an example receiver circuit 40 including diode saturation ballasted SiGe devices 48a, . . . , 48n according to the invention. The receiver circuit 40 comprises an input pad 42 connected to plurality of respective transistor receive devices 44a, . . . , 44n configured to receive input signals, with the emitter of each transistor device 44a, . . . , 44n connected in series with a respective diode configured SiGe diode saturation element (or SiGe varactor or p-i-n) 48a, . . . , 48n for providing overcurrent protection. FIG. 5A illustrates another example embodiment of a receiver circuit 40' including diode saturation ballasted SiGe devices 48a', . . . , 48n' exhibiting velocity saturation characteristics according to the invention.

FIG. 6 illustrates an example BiCMOS receiver circuit 50 including a network of receiver devices 54a, . . . , 54n (e.g., npn SiGe receivers) each receiving signals from an input pad 52 through a respective current limiting SiGe heterojunction bipolar transistor (HBT) diode saturation ballast element 58a, . . . , 58n according to the invention. FIG. 6A illustrates another example embodiment of a receiver circuit 50' including diode saturation ballasted SiGe devices 58a', . . . , 58n' exhibiting velocity saturation characteristics according to the invention.

Figure 7:
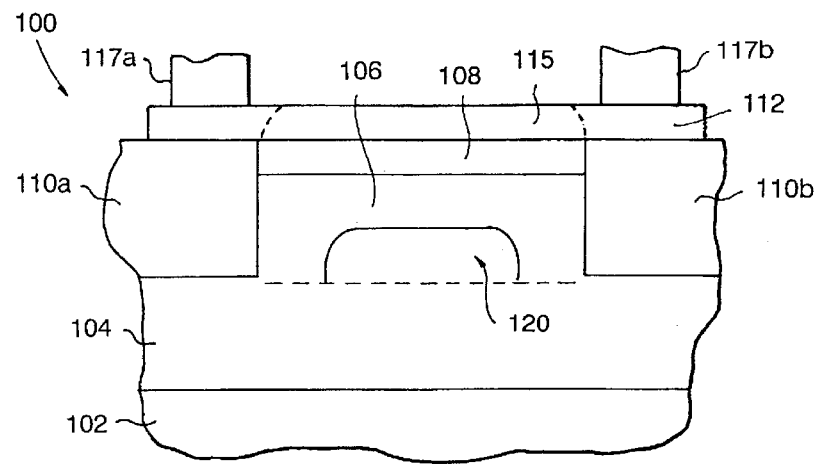
FIG. 7 illustrates a cross-sectional view of the SiGe Varactor (PIN) Diode structure 100 according to the invention.

Reference is now made to FIG. 7 which illustrates a cross-sectional view of the SiGe Varactor (or PIN) Diode structure 100 according to the invention. Specifically, the SiGe Varactor (PIN) Diode structure of FIG. 7 is formed from an npn transistor structure, and comprises a semiconductor substrate 102, e.g., a p-type substrate, a sub-collector layer 104 formed of N++ material (ion implanted) and two shallow trench isolation regions (STI) 110a, 110b defining an epitaxial collector region 106 formed of N− material (epitaxially grown or ion implanted) and an intrinsic base region 108, e.g., formed of single crystal SiGe p+ material formed between the isolation regions above the epitaxial collector 106. Further included is a low-temperature epitaxy (LTE) PolySilicon Germanium extrinsic base region 112 formed by ultra-high vacuum chemical vapor definition (UHV/CVD) process on top of the base region 108 in overlapping relation with each STI region 110a, b. It is understood that the Ge concentration may be varied during the film deposition process to provide position-dependent SiGe alloy film for profile and device optimization of the base region. For instance, included in the LTE PolySilicon Germanium layer 112 is a doped epitaxial SiGe region 115 (e.g., p+ material) formed on top of the base region 108 between the STI regions. A diode contact, e.g., mirrored metal contacts 117a, b, may be formed on top of the LTE SiGe layer 112 as shown disposed in alignment with respective STI region 110, b on each side of respective SiGe layer 112 facets 118a,b. The varactor structure further comprises an N+ pedestal implant (reach-through) region 120 formed between the subcollector 104 and epitaxial collector 106 regions. Without the pedestal implant, the structure is referred to as a SiGe p-i-n structure. This pedestal implant region is optional and may be formed in the varactor (FIG. 7) and a heterojunction bipolar transistor (HBT) device (for example as shown and described with respect to FIG. 8) for enhancing high-frequency SiGe npn device performance by increasing the RF device cutoff frequency $f_T$ and providing a low-resistance collector, and further increases collector-emitter breakdown voltage ($BV_{CEO}$) and improves velocity saturation effect to enhance ESD robustness.

Figure 8:
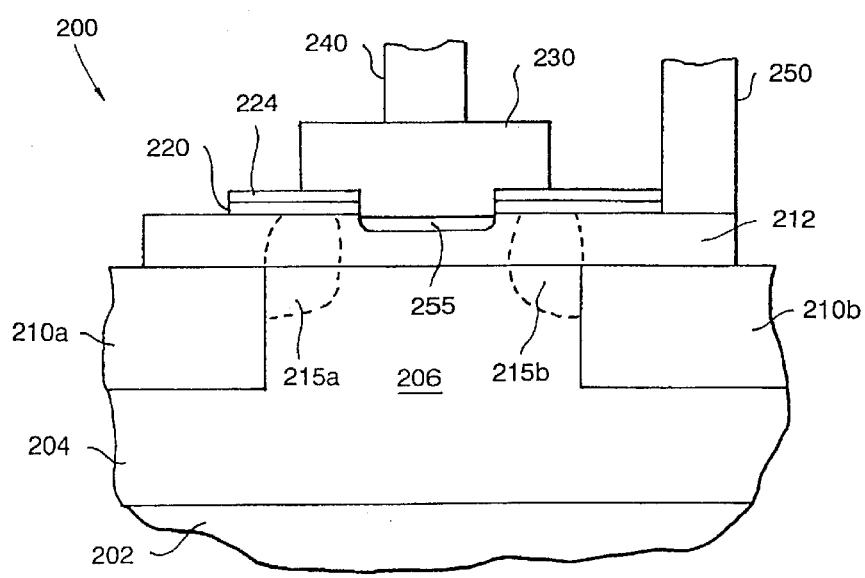
FIG. 8 illustrates a cross-sectional view of the SiGe Epitaxial Base NPN 200 according to the invention.

FIG. 8 illustrates a cross-sectional view of the SiGe Epitaxial Base NPN 200 according to the invention. Specifically, the SiGe Epitaxial Base NPN structure of FIG. 8 is an HBT device comprising a semiconductor substrate 202, e.g., a p-type substrate, a sub-collector layer 204 formed of N+ material (ion implanted) and two shallow trench isolation regions (STI) 210a, 210b defining an epitaxial collector region 206. Further included is a low-temperature epitaxy (LTE) PolySilicon Germanium extrinsic base region 212 formed of p− dopant material by UHV/CVD process on top of the base region 208 in overlapping relation with each STI region 210a, b. It is understood that the Ge concentration may be varied during the film deposition process to provide position-dependent SiGe alloy film for profile and device optimization of the base region. Further included are extrinsic base implant regions 215a,b, e.g., p+ dopant material, extending into the collector region 206 and abutting a respective STI region 210a, b for decreasing the extrinsic base resistance. According to conventional processing steps, Silicon oxide 220 and Nitride film layers 224 are formed over the base region (LTE SiGe film) 212 and utilizing a mask, an emitter hole is etched therethrough to define an emitter window in the LTE SiGe film 212. It is through this emitter window that an N+ emitter doped implant region 225 is formed. A final N+ doped polysilicon emitter film 230 is formed on top of the emitter region 225 overlaying silicon Oxide and Nitride film layers 220, 224. Finally, emitter 240, base 250 and collector contacts may be formed.

Figure 9A:
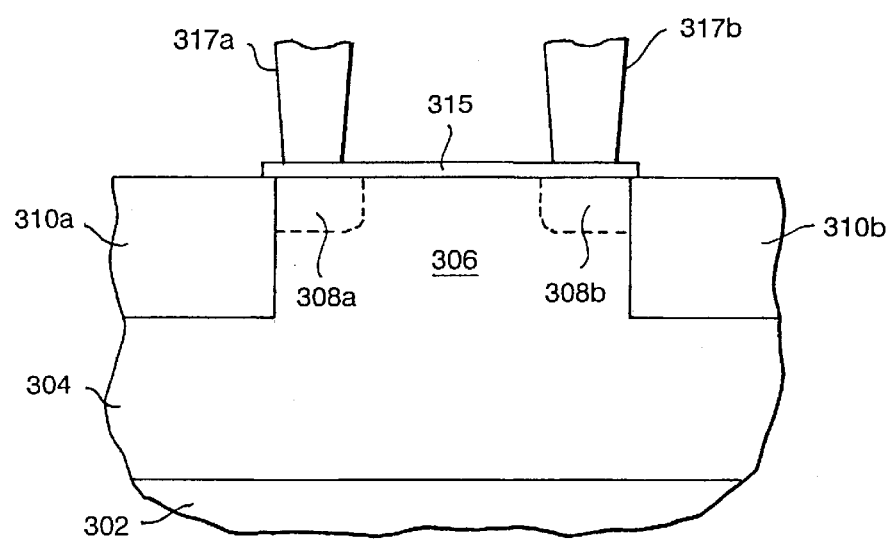
FIGS. 9(a) and 9(b) illustrate cross-sectional views of respective SiGe Schottkey diode devices 300, 400, configured in accordance with the invention.

FIG. 9(a) illustrates a cross-sectional view of the SiGe-Schottky diode configuration 300 which is similar to the P-I-N diode structure 100 of FIG. 7 (i.e., without the pedestal implant structure) however includes metal layer 315. Specifically, as shown in FIG. 9(a), the SiGe Schottky diode configuration includes a semiconductor substrate 302, e.g., a p-type substrate, a sub-collector layer 304 formed of N++ material (ion implanted) and two shallow trench isolation regions (STI) 310a, 310b defining an epitaxial collector region 306 formed of N− material (epitaxially grown or ion implanted) and an intrinsic base region 308a, 308b, e.g., formed of single crystal SiGe p+ material. Formed on top of this region is a Titanium Silicide metal layer 315 for connection with contacts 317a,b.

Figure 9B:
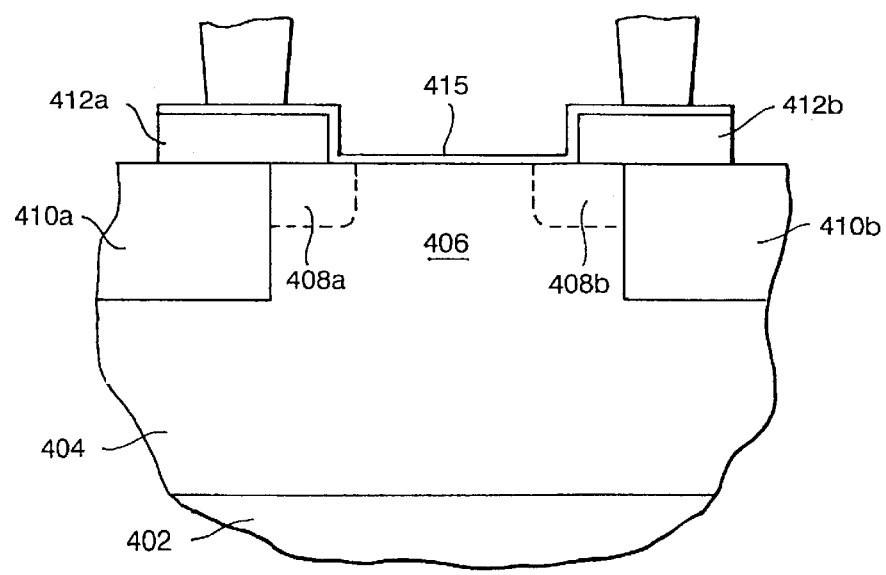

FIG. 9(b) illustrates a cross-sectional view of the SiGe Schottky diode configuration 400 which is similar to the Schottky diode configuration 300 of FIG. 9(a), however, further includes LTE PolySilicon Germanium extrinsic base region 412a,b formed by UHV/CVD process. Particularly, SiGe Schottky device 400 includes a semiconductor substrate 402, e.g., a p-type substrate, a sub-collector layer 404 formed of N++ material (ion implanted) and two shallow trench isolation regions (STI) 410a, 410b defining an epitaxial collector region 406 formed of N− material and an intrinsic base region 408a, 408b, e.g., formed of single crystal SiGe p+ material. In overlapping relation with each region 412a,b and intrinsic base region 408a, 408b, is a Silicide layer 415 (e.g., self-aligned or Salicide layer) according to the invention.

The dopant concentrations for each of the devices illustrated in FIGS. 7, 8, and 9(a) and 9(b) are as follows: The emitter regions for a SiGe npn may include a concentration of dopants ranging anywhere between $10^{19}$ cm$^{-3}$ to $10^{22}$ cm$^{-3}$, whereas the SiGe base region may include a concentration of dopants ranging anywhere between $10^{17}$ cm$^3$ to $10^{19}$ cm$^{-3}$. It is understood that the concentration of Ge in the SiGe base region may be greater than 0% with peak values ranging anywhere between 5% and 25%. The Ge profile formed may be of triangular, trapezoidal (plateaued) or rectangular shaped. For the collector regions, the dopant concentration values may range anywhere between $10^{17}$ cm$^{-3}$ (low dopant collector region) to $10^{21}$ cm$^{-3}$ (higher doped collector region)

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

Having thus described our invention, what we claim as new, and desire to secure by Letters Patent is:

1. An SiGe device comprising:
   a semiconductor substrate of a first conductivity type;
   a doped collector region formed on top of said semiconductor substrate, said doped collector region of second conductivity type;
   shallow trench isolation (STI) regions extending into said device to define an extrinsic collector portion of said doped collector region therebetween and defining an intrinsic SiGe base portion of said first conductivity type above said extrinsic collector portion therebetween, and;
   a polysilicon germanium layer forming an extrinsic base region of a first conductivity type overlaying said intrinsic base portion and surfaces of said STI regions,
   wherein said device is configured to exhibit high velocity saturation resistance characteristic for buffering large voltages at low currents.

2. The SiGe device as claimed in claim 1, wherein said doped collector region includes a pedestal region comprising said second conductivity type material of a concentration different from that of said doped collector region.

3. The SiGe device as claimed in claim 1, wherein said polysilicon geranium layer forming said extrinsic base region is grown by low temperature epitaxy.

4. The SiGe device as claimed in claim 3, wherein said polysilicon germanium layer grown by low temperature epitaxy forming said extrinsic base region includes a varied Ge concentration to provide position-dependent SiGe alloy film for device optimization.

5. The SiGe device as claimed in claim 1, wherein said doped collector region includes sub-collector layer.

6. A Heterojunction Bipolar Transistor (HBT) SiGe device comprising:
   a semiconductor substrate of a first conductivity type;
   a doped collector region formed on top of said semiconductor substrate, said doped collector region of second conductivity type;
   shallow trench isolation (STI) regions extending into said device to define an extrinsic collector portion of said doped collector region therebetween and defining an intrinsic SiGe base portion of said first conductivity type above said extrinsic collector portion therebetween, and;
   a polysilicon germanium layer grown by low temperature epitaxy forming an extrinsic base region of a first conductivity type overlaying said intrinsic SiGe base portion and surfaces of said STI regions, said polysilicon germanium layer including an emitter implant region of said second conductivity type aligned with said intrinsic SiGe base portion,
   a dielectric film formed on said extrinsic base region defining said emitter implant region; and,
   a polysilicon germanium layer of said second conductivity type forming an emitter region overlaying said dielectric film and said emitter implant region for contact therewith,
   wherein said HBT SiGe device base region is electrically connected with said emitter region, said collector and base regions forming a base-collector diode, said device being selectively doped to exhibit high velocity saturation resistance characteristic for buffering large voltages at low currents.

7. The HBT SiGe device as claimed in claim 6, wherein said collector region includes a pedestal region comprising said second conductivity type material of a concentration different from that of said doped collector region for enhancing high-frequency SiGe npn device performance by increasing the RF device cutoff frequency $f_T$ for high-frequency applications and improving velocity saturation effect.

8. The HBT SiGe device as claimed in claim 7, wherein said polysilicon germanium layer grown by low temperature epitaxy forming said extrinsic base region includes a varied Ge concentration to provide position-dependent SiGe alloy film for device optimization.

* * * * *